(12) United States Patent
Kim et al.

(10) Patent No.: US 9,177,942 B2
(45) Date of Patent: Nov. 3, 2015

(54) SEMICONDUCTOR PACKAGE AND METHOD OF FABRICATING THE SAME

(71) Applicant: Samsung Electronics Co., Ltd., Suwon-si, Gyeonggi-do (KR)

(72) Inventors: Wonkeun Kim, Hwaseong-si (KR); In-Young Lee, Yongin-si (KR); Chang-Seong Jeon, Yongin-si (KR); Taeje Cho, Hwaseong-si (KR)

(73) Assignee: SAMSUNG ELECTRONICS CO., LTD. (KR)

( * ) Notice: Subject to any disclaimer, the term of this patent is extended or adjusted under 35 U.S.C. 154(b) by 0 days.

(21) Appl. No.: 14/463,650

(22) Filed: Aug. 19, 2014

(65) Prior Publication Data

US 2015/0069635 A1  Mar. 12, 2015

(30) Foreign Application Priority Data

Sep. 11, 2013 (KR) .................. 10-2013-0109199

(51) Int. Cl.
*H01L 23/34* (2006.01)
*H01L 25/10* (2006.01)
(Continued)

(52) U.S. Cl.
CPC ............ *H01L 25/105* (2013.01); *H01L 23/345* (2013.01); *H01L 23/36* (2013.01); *H01L 23/3677* (2013.01); *H01L 24/19* (2013.01); *H01L 25/50* (2013.01); *H01L 23/3128* (2013.01); *H01L 2225/06589* (2013.01);
(Continued)

(58) Field of Classification Search
CPC . H01L 21/563; H01L 21/565; H01L 21/8229; H01L 23/34; H01L 23/345; H01L 23/3114; H01L 23/315; H01L 23/36; H01L 23/4951; H01L 23/49568; H01L 23/3736; H01L 23/53242; H01L 23/53233; H01L 23/53219
USPC ............ 257/718, 719, 720, 99, 100, 68, 296, 257/276, 310, 396, 643, 678, 706, 717, 725, 257/728, 737, 747, 762, 766, 765, 771, 778, 257/787, E21.005, E21.006, E21.007, 257/E21.084, E21.324, E21.508, E21.509, 257/E21.645, E21.646
See application file for complete search history.

(56) References Cited

U.S. PATENT DOCUMENTS 5,222,014 A   6/1993  Lin
6,873,639 B2  3/2005  Zhang
(Continued)

FOREIGN PATENT DOCUMENTS

JP   2006059871 A   3/2006
JP   2008177241 A   7/2008
(Continued)

*Primary Examiner* — David Nhu
(74) *Attorney, Agent, or Firm* — Renaissance IP Law Group LLP (57) ABSTRACT

Provided are semiconductor packages and methods of fabricating the same. The method may include mounting a first semiconductor chip including chip and heat-transfer regions and a lower heat-transfer pattern disposed on the heat-transfer region, on a substrate, mounting a second semiconductor chip on the chip region of the first semiconductor chip, forming a mold layer on the substrate to enclose the first and second semiconductor chips, forming an opening in the mold layer to expose at least a portion of the lower heat-transfer pattern, forming a heat-pathway pattern in the opening, and forming a heat-dissipating part on the second semiconductor chip and the mold layer to be connected to the heat-pathway pattern.

13 Claims, 11 Drawing Sheets

(51) Int. Cl.
*H01L 25/00* (2006.01)
*H01L 23/36* (2006.01)
*H01L 23/367* (2006.01)
*H01L 23/00* (2006.01)
*H01L 23/31* (2006.01)

(52) U.S. Cl.
CPC . *H01L2225/1023* (2013.01); *H01L 2225/1058* (2013.01); *H01L 2225/1094* (2013.01)

(56) References Cited

U.S. PATENT DOCUMENTS

| | | | |
|---|---|---|---|
| 7,361,986 | B2 | 4/2008 | Yuan et al. |
| 7,843,058 | B2 | 11/2010 | Tsao et al. |
| 8,026,587 | B1 | 9/2011 | Hiner et al. |
| 8,212,352 | B2 | 7/2012 | Pendse |
| 8,299,608 | B2 * | 10/2012 | Bartley et al. ................. 257/712 |
| 8,941,233 | B1 * | 1/2015 | Ngai et al. ..................... 257/712 |
| 2002/0105997 | A1 | 8/2002 | Zhang |
| 2006/0113663 | A1 | 6/2006 | Yuan et al. |
| 2008/0237817 | A1 | 10/2008 | Pendse |
| 2009/0108429 | A1 | 4/2009 | Tsao et al. |
| 2012/0007229 | A1 | 1/2012 | Bartley et al. |
| 2012/0275220 | A1 | 11/2012 | Liu et al. |

FOREIGN PATENT DOCUMENTS

| | | |
|---|---|---|
| KR | 20050051806 A | 6/2005 |
| KR | 101099577 B1 | 12/2011 |

* cited by examiner

SEMICONDUCTOR PACKAGE AND METHOD OF FABRICATING THE SAME

CROSS-REFERENCE TO RELATED APPLICATIONS

This U.S. non-provisional patent application claims priority under 35 U.S.C. §119 to Korean Patent Application No. 10-2013-0109199, filed on Sep. 11, 2013, in the Korean Intellectual Property Office, the entire contents of which are hereby incorporated by reference.

BACKGROUND

Example embodiments of the inventive concept relate to a semiconductor device, and in particular, to a multi-chip semiconductor package including a heat-dissipating part.

With the development of the electronics industry, it becomes possible to manufacture light, small, fast, and high-performance electronic products in a cost-efficient manner. The electronic products may include integrated circuit ICs to be provided in the form of a semiconductor package, and various studies are being conducted on improving reliability of the semiconductor packages. Particularly, with increasing demands for high-speed and high-capacity semiconductor devices, the semiconductor devices may consume electric power more and more. Thus, thermal characteristics of the semiconductor packages are becoming more and more important.

SUMMARY

Example embodiments of the inventive concept provide a highly-reliable semiconductor package, in which a semiconductor chip having an improved heat-dissipation property is provided.

Other example embodiments of the inventive concept provide a method of fabricating a semiconductor package, in which a semiconductor chip having an improved heat-dissipation property is provided. Here, the method may be configured to prevent the semiconductor chip from being damaged.

According to example embodiments of the inventive concept, a method of fabricating a semiconductor package may include mounting a first semiconductor chip on a substrate. Here, the first semiconductor chip may include a chip region and a heat-transfer region and include a lower heat-transfer pattern disposed on the heat-transfer region. The method may further include mounting a second semiconductor chip on the chip region of the first semiconductor chip, forming a mold layer on the substrate to enclose the first and second semiconductor chips, forming an opening in the mold layer to expose at least a portion of the lower heat-transfer pattern, forming a heat-pathway pattern in the opening, and forming a heat-dissipating part on the second semiconductor chip and the mold layer to be connected to the heat-pathway pattern.

In example embodiments, the first semiconductor chip may include a heat source, and the lower heat-transfer pattern may be overlapped with the heat source.

In example embodiments, the method may further include forming a heat-transfer layer between the second semiconductor chip and the heat-dissipating part. The heat-transfer layer may include substantially the same material as the heat-pathway pattern.

In example embodiments, the method may further include mounting a third semiconductor chip on a top surface of the second semiconductor chip, before the forming of the mold layer. The top surface of the second semiconductor chip may include an upper chip region and an upper heat-transfer region and include an upper heat-transfer pattern disposed on the upper heat-transfer region, and the third semiconductor chip may be disposed on the upper chip region and be enclosed by the mold layer. The method may further include forming an upper opening in the mold layer to expose at least a portion of the upper heat-transfer pattern, and forming an upper heat-pathway pattern in the upper opening to be connected to the upper heat-transfer pattern.

In example embodiments, the first semiconductor chip may include a plurality of heat sources spaced apart from each other, and the lower heat-transfer pattern may be overlapped with at least two of the heat sources.

In example embodiments, the heat-pathway pattern may include a conductive material and/or an adhesive polymer.

In example embodiments, the lower heat-transfer pattern may include a metal material.

According to example embodiments of the inventive concept, a semiconductor package may include a first semiconductor chip mounted on a substrate to have a top surface including a chip region and a heat-transfer region, a second semiconductor chip mounted on the chip region of the first semiconductor chip, a lower heat-transfer pattern disposed on the heat-transfer region of the first semiconductor chip, a mold layer provided on the substrate to enclose the first semiconductor chip and the second semiconductor chip, a heat-pathway pattern provided through the mold layer and connected to the lower heat-transfer pattern, and a heat-dissipating part disposed on the second semiconductor chip and the mold layer and connected to the heat-pathway pattern.

In example embodiments, the first semiconductor chip may include a heat source, and the lower heat-transfer pattern may be overlapped with the heat source.

In example embodiments, the semiconductor package may further include a heat-transfer layer interposed between the second semiconductor chip and the heat-dissipating part. The heat-transfer layer may include substantially the same material as the heat-pathway pattern.

In example embodiments, the heat-pathway pattern may include a conductive material and/or an adhesive polymer and have a thermal conductivity higher than that of the mold layer.

In example embodiments, the semiconductor package may further include a third semiconductor chip disposed on the second semiconductor chip. The second semiconductor chip may include an upper chip region and an upper heat-transfer region, the third semiconductor chip may be mounted on the upper chip region of the second semiconductor chip, and the mold layer may be provided to seal hermetically the first, second, and third semiconductor chips. The semiconductor package may further include an upper heat-transfer pattern disposed on the upper heat-transfer region of the second semiconductor chip, and an upper heat-pathway pattern interposed between the upper heat-transfer pattern and the heat-dissipating part.

In example embodiments, the first semiconductor chip may include a plurality of heat sources spaced apart from each other, and the lower heat-transfer pattern may be overlapped with at least two of the heat sources.

In example embodiments, the lower heat-transfer pattern may be a metal pattern.

In example embodiments, the lower heat-transfer pattern may include at least one of copper, nickel, gold, or aluminum.

BRIEF DESCRIPTION OF THE DRAWINGS

Example embodiments will be more clearly understood from the following brief description taken in conjunction with the accompanying drawings. The accompanying drawings represent non-limiting, example embodiments as described herein.

It should be noted that these figures are intended to illustrate the general characteristics of methods, structure and/or materials utilized in certain example embodiments and to supplement the written description provided below. These drawings are not, however, to scale and may not precisely reflect the precise structural or performance characteristics of any given embodiment, and should not be interpreted as defining or limiting the range of values or properties encompassed by example embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION

Example embodiments of the inventive concepts will now be described more fully with reference to the accompanying drawings, in which example embodiments are shown. Example embodiments of the inventive concepts may, however, be embodied in many different forms and should not be construed as being limited to the embodiments set forth herein; rather, these embodiments are provided so that this disclosure will be thorough and complete, and will fully convey the concept of example embodiments to those of ordinary skill in the art. In the drawings, the thicknesses of layers and regions are exaggerated for clarity. Like reference numerals in the drawings denote like elements, and thus their description will be omitted.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Like numbers indicate like elements throughout. As used herein the term "and/or" includes any and all combinations of one or more of the associated listed items. Other words used to describe the relationship between elements or layers should be interpreted in a like fashion (e.g., "between" versus "directly between," "adjacent" versus "directly adjacent," "on" versus "directly on").

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises", "comprising", "includes" and/or "including," if used herein, specify the presence of stated features, integers, steps, operations, elements and/or components, but do not preclude the presence or addition of one or more other features, integers, steps, operations, elements, components and/or groups thereof.

Unless otherwise defined, all terms (including technical and scientific terms) used herein have the same meaning as commonly understood by one of ordinary skill in the art to which example embodiments of the inventive concepts belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

Figure 1:
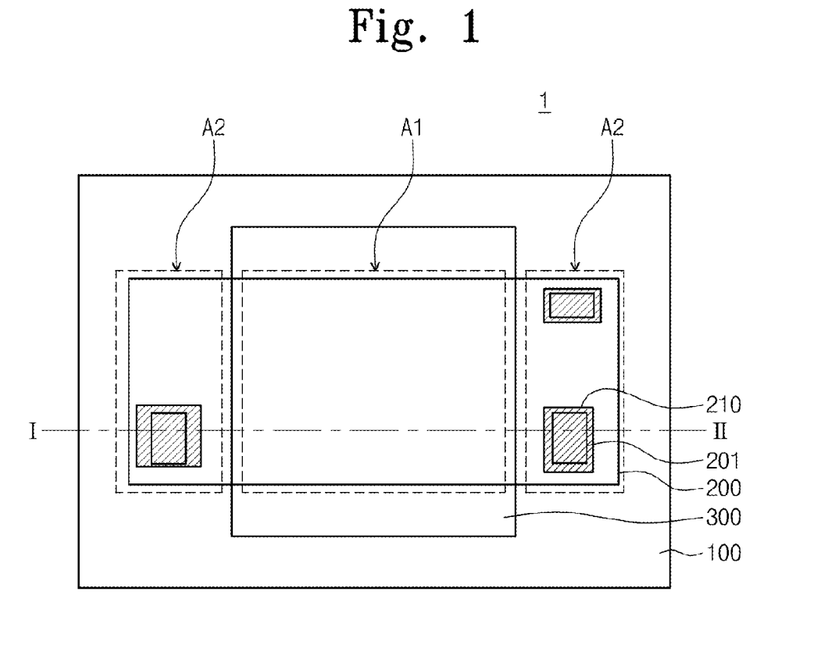
FIG. 1 is a plan view illustrating a semiconductor package according to example embodiments of the inventive concept.
Figure 2:
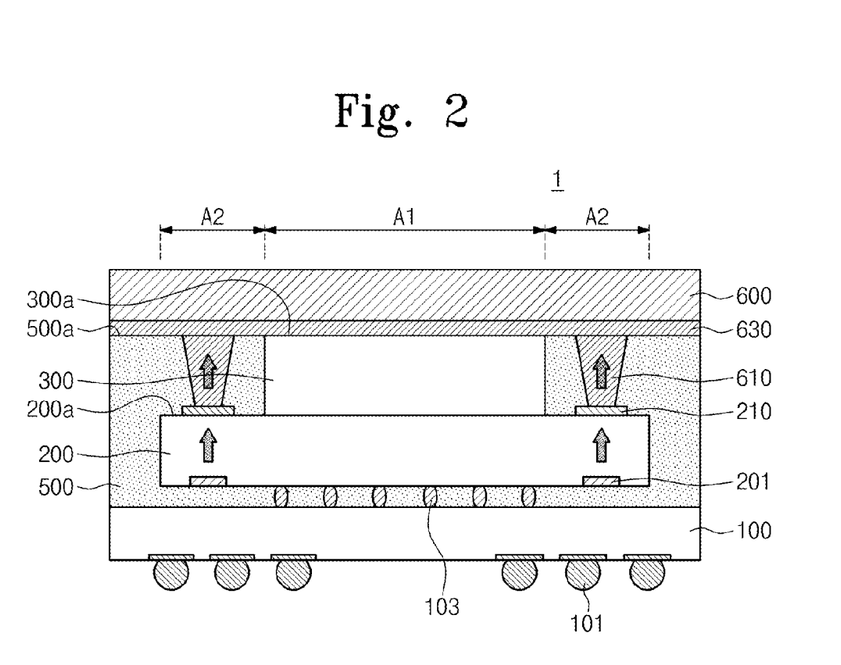
FIG. 2 is a cross-sectional view taken along line I-II of FIG. 1.

FIG. 1 is a plan view illustrating a semiconductor package according to example embodiments of the inventive concept, and FIG. 2 is a cross-sectional view taken along line I-II of FIG. 1.

Referring to FIGS. 1 and 2, a semiconductor package 1 may include a substrate 100, a first semiconductor chip 200, a second semiconductor chip 300, a mold layer 500, a lower heat-transfer pattern 210, a heat-pathway pattern 610, and a heat-dissipating part 600. The semiconductor package 1 may be a multi-chip package including a plurality of semiconductor chips.

The substrate 100 may be a printed circuit board (PCB), in which circuit patterns are provided. An external terminal 101 may be provided on a bottom surface of the substrate 100. The external terminal 101 may include a conductive material and be provided in the form of a solder ball. The external terminal 101 may connect the first and second semiconductor chips 200 and 300 electrically to an external electric device (not shown).

The first semiconductor chip 200 may be provided on the substrate 100. Connection terminals 103 may be provided between the substrate 100 and the first semiconductor chip 200. The first semiconductor chip 200 may be electrically connected to the substrate 100 via the connection terminals 103. The connection terminals 103 may include a conductive material and be provided in the form of a solder ball or bump. Alternatively, the first semiconductor chip 200 may be connected to the substrate 100 through a bonding wire (not shown). The first semiconductor chip 200 may have a top surface 200a including a chip region A1 and a heat-transfer region A2. In the chip region A1, the first semiconductor chip 200 may be overlapped with the second semiconductor chip 300. In the heat-transfer region A2, the first semiconductor chip 200 may not be overlapped with the second semiconductor chip 300.

The first semiconductor chip 200 may include an integrated circuit, for example, a memory circuit, a logic circuit, or any combination thereof. The first semiconductor chip 200 may have a heat source 201 provided therein. In certain embodiments, the heat source 201 may be a block that may be provided in the form of hardware or software and constitute a semiconductor integrated circuit. For example, the heat source 201 may be a central processing unit (CPU) or a circuit constituting the CPU. In some embodiments, the heat source 201 may be a part of a logic circuit.

The second semiconductor chip 300 may be provided on the top surface 200a of the first semiconductor chip 200. The second semiconductor chip 300 may be provided on the chip region A1. The second semiconductor chip 300 may be mounted in a flip-chip bonding manner on the substrate 100 using a solder ball or a conductive bump (not shown). Alternatively, the second semiconductor chip 300 may be connected to the substrate 100 through a bonding wire (not shown). The second semiconductor chip 300 may include an integrated circuit, for example, a logic circuit, a memory circuit, or any combination thereof. The second semiconductor chip 300 may be of a different kind from the first semiconductor chip 200. For example, the first semiconductor chip 200 may include a logic circuit, while the second semiconductor chip 300 may include a memory circuit. The logic circuit may be a part of a microprocessor, a digital signal processor, a microcontroller, or other logic devices.

The lower heat-transfer pattern 210 may be disposed on the top surface 200a of the first semiconductor chip 200. The lower heat-transfer pattern 210 may be provided on the heat-transfer region A2 such that it may not be overlapped with the second semiconductor chip 300. The lower heat-transfer pattern 210 may include a conductive material, for example, metal. For example, the lower heat-transfer pattern 210 may include at least one of copper (Cu), nickel (Ni), gold (Au), and aluminum (Al). The lower heat-transfer pattern 210 may have a thermal conductivity higher than that of the mold layer 500. The lower heat-transfer pattern 210 may be overlapped with the heat source 201. In some embodiments, the lower heat-transfer pattern 210 may be vertically overlapped with the heat source 201. In other words, the lower heat-transfer pattern 210 may overlie the heat source 201. When heat is generated from the heat source 201 of the first semiconductor chip 200, the heat may be transferred to the heat-pathway pattern 610 through the lower heat-transfer pattern 210.

The heat-pathway pattern 610 may be interposed between the first semiconductor chip 200 and the heat-dissipating part 600. The heat-pathway pattern 610 may be provided in the heat-transfer region A2 of the first semiconductor chip 200. The heat-pathway pattern 610 may be in contact with the lower heat-transfer pattern 210 and may be spaced apart from the top surface 200a of the first semiconductor chip 200. The heat-pathway pattern 610 may be overlapped with the lower heat-transfer pattern 210. In some embodiments, the heat-pathway pattern 610 may be vertically overlapped with the lower heat-transfer pattern 210. In other words, the heat-pathway pattern 610 may overlie the lower heat-transfer pattern 210. The heat-pathway pattern 610 may include a material, whose thermal conductivity is higher than that of the mold layer 500. For example, the heat-pathway pattern 610 may include a conductive material and/or an adhesive polymer. The conductive material may include at least one of aluminum (Al), tin (Sn), copper (Cu), silver (Ag), aluminum oxide ($Al_2O_3$), zinc oxide (ZnO), silicon carbide (SiC), aluminum nitride (AlN), boron nitride (BN), diamond, or any combination thereof. When heat is generated from the heat source 201 of the first semiconductor chip 200, the heat may be easily transferred to the heat-dissipating part 600 through the lower heat-transfer pattern 210 and the heat-pathway pattern 610. Accordingly, the first semiconductor chip 200 can have improved operation reliability, compared to a case where the lower heat-transfer pattern 210 and the heat-pathway pattern 610 are omitted.

The heat-dissipating part 600 may be provided on the second semiconductor chip 300. The heat-dissipating part 600 may include a material with high thermal conductivity. For example, the heat-dissipating part 600 may include at least one of a heat slug, a heat sink, or a graphite sheet. The heat-dissipating part 600 may be configured to dissipate heat generated from the first and second semiconductor chips 200 and 300. A heat-transfer layer 630 may be disposed between the second semiconductor chip 300 and the heat-dissipating part 600. The heat-transfer layer 630 may be connected to the heat-pathway pattern 610. The heat-transfer layer 630 may be extended between the mold layer 500 and the heat-dissipating part 600. The heat-transfer layer 630 may include substantially the same material as the heat-pathway pattern 610. For example, the heat-transfer layer 630 may include a conductive material and/or an adhesive polymer. The heat-dissipating part 600 may be attached to the second semiconductor chip 300 and the mold layer 500 through the heat-transfer layer 630. When heat is generated from the first and second semiconductor chips 200 and 300, the heat may be transferred to the heat-dissipating part 600 through the heat-transfer layer 630. Accordingly, the first and second semiconductor chips 200 and 300 of the semiconductor package 1 can have improved operation reliability, compared to a case where the heat-transfer layer 630 and the heat-dissipating part 600 are omitted.

The mold layer 500 may be interposed between the substrate 100 and the heat-dissipating part 600 to encapsulate the first and second semiconductor chips 200 and 300. The mold layer 500 may include an insulating polymer, such as an epoxy molding compound. The mold layer 500 may have an uppermost surface 500a coplanar with a top surface 300a of the second semiconductor chip 300. Accordingly, the second semiconductor chip 300 may be in contact with the heat-transfer layer 630. Alternatively, the mold layer 500 may include a portion extending between the second semiconductor chip 300 and the heat-transfer layer 630.

Figure 3:
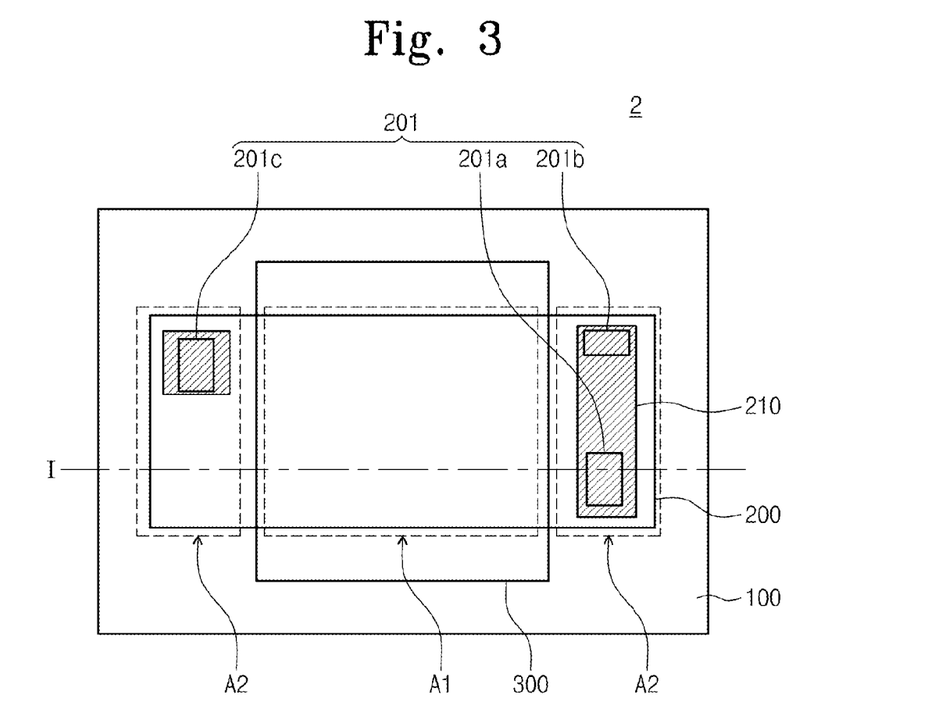
FIG. 3 is a plan view illustrating a semiconductor package according to other example embodiments of the inventive concept.
Figure 4:
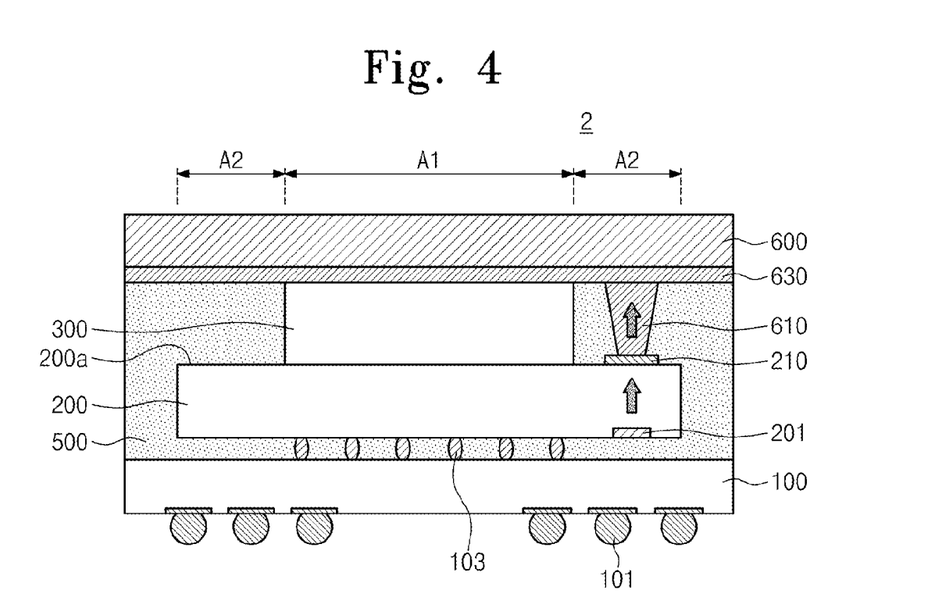
FIG. 4 is a cross-sectional view taken along line I-II of FIG. 3.

FIG. 3 is a plan view illustrating a semiconductor package according to other example embodiments of the inventive concept, and FIG. 4 is a cross-sectional view taken along line I-II of FIG. 3. For the sake of brevity, the elements and features of this example similar to those previously shown and described will not be described in much further detail.

Referring to FIGS. 3 and 4, a semiconductor package 2 may include a substrate 100, a first semiconductor chip 200, a second semiconductor chip 300, a mold layer 500, a lower heat-transfer pattern 210, a heat-pathway pattern 610, and a heat-dissipating part 600. The substrate 100, the first semiconductor chip 200, the second semiconductor chip 300, the mold layer 500, and the heat-dissipating part 600 may be configured to have substantially the same features as those of the previous embodiments.

The first semiconductor chip 200 may include a plurality of heat sources 201 spaced apart from each other; for example, a first heat source 201a, a second heat source 201b, and a third heat source 201c. A lower heat-transfer pattern 210 may be provided in the heat-transfer region A2. The lower heat-transfer pattern 210 may have a shape elongated or extending along a specific direction on the top surface 200a of the first semiconductor chip 200. The lower heat-transfer pattern 210 may be overlapped with at least two of the heat sources 201. For example, the lower heat-transfer pattern 210 may be overlapped with the first and second heat sources 201a and 201b. The lower heat-transfer pattern 210 may include a metal material described with reference to FIGS. 1 and 2.

The heat-pathway pattern 610 may be interposed between the lower heat-transfer pattern 210 and the heat-dissipating part 600. The heat-pathway pattern 610 may penetrate the mold layer 500 and may be in contact with the lower heat-transfer pattern 210. The heat-pathway pattern 610 may be provided in the heat-transfer region A2. The heat-pathway pattern 610 may be overlapped with the lower heat-transfer pattern 210. When heat is generated from the first heat source 201 and the second heat source 201, the heat may be transferred to the heat-dissipating part 600 through the lower heat-transfer pattern 210 and the heat-pathway pattern 610.

FIGS. 5A through 5D are plan views illustrating some examples of a lower heat-transfer pattern and a heat-pathway pattern, according to example embodiments of the inventive concept.

Figure 5A:
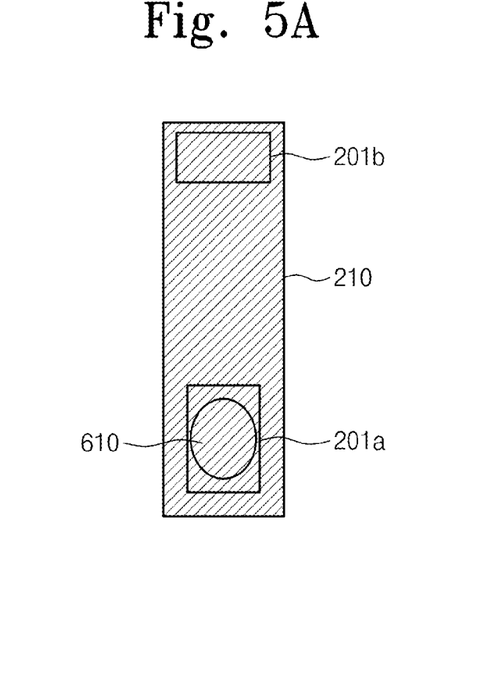
FIGS. 5A through 5D are plan views illustrating some examples of a lower heat-transfer pattern and a heat-pathway pattern, according to example embodiments of the inventive concept.

As shown in FIGS. 5A through 5D, the lower heat-transfer pattern 210 may be overlapped with the first and second heat sources 201a and 201b. For example, as shown in FIG. 5A, the heat-pathway pattern 610 may be overlapped with either of the first and second heat sources 201a and 201b. For example, the heat-pathway pattern 610 may be overlapped with the first heat source 201a but not overlapped with the second heat source 201b or vice versa.

Figure 5B:
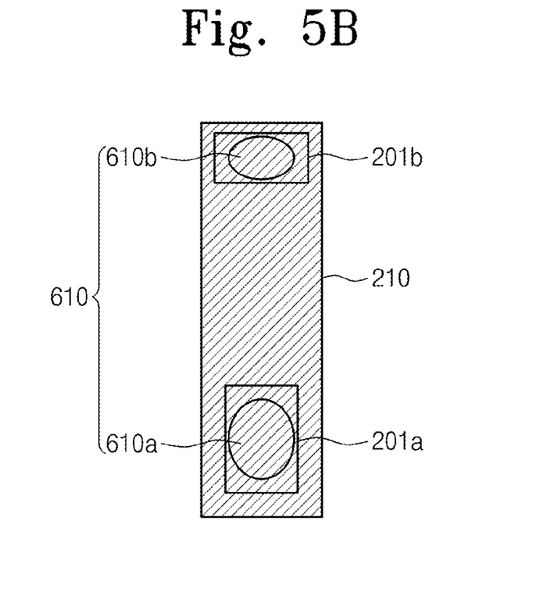

Referring to FIG. 5B, the heat-pathway pattern 610 may include a first heat-pathway pattern 610a and a second heat-pathway pattern 610b. The first heat-pathway pattern 610a may be overlapped with the first heat source 201a, and the second heat-pathway pattern 610b may be overlapped with the second heat source 201b. The second heat-pathway pattern 610b may be spaced apart from the first heat-pathway pattern 610a.

Figure 5C:
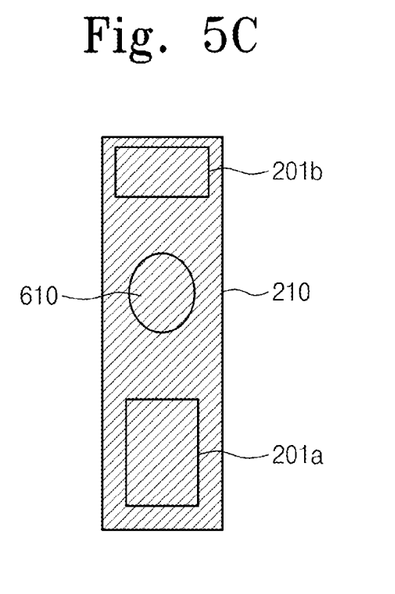

Referring to FIG. 5C, in some embodiments, the heat-pathway pattern 610 may be overlapped with the lower heat-transfer pattern 210 but not overlapped with the first and second heat sources 201a and 201b.

Figure 5D:
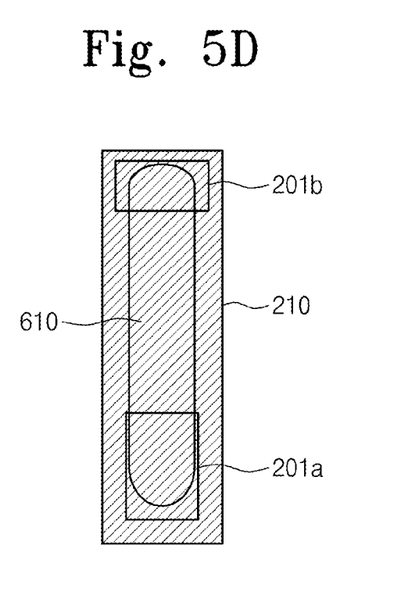

Referring to FIG. 5D, in some other embodiments, the heat-pathway pattern 610 may be overlapped with the first and second heat sources 201a and 201b.

Referring back to FIG. 4, the heat-dissipating part 600 may be disposed overlying the second semiconductor chip 300 and the mold layer 500. The heat-transfer layer 630 may be disposed between the heat-dissipating part 600 and the heat-pathway pattern 610.

Figure 6:
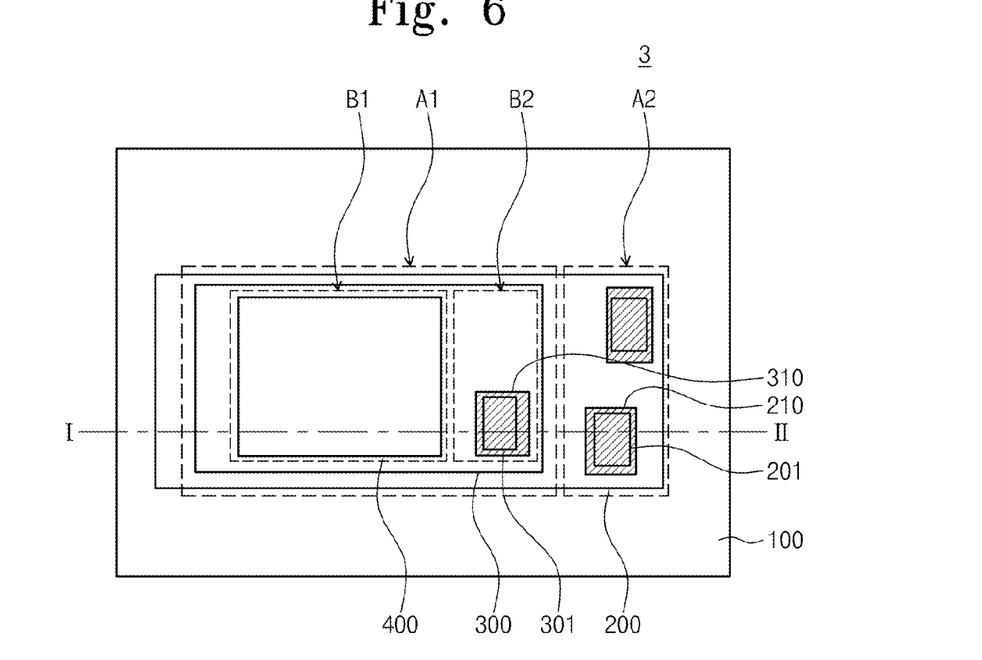
FIG. 6 is a plan view illustrating a semiconductor package according to still other example embodiments of the inventive concept.
Figure 7:
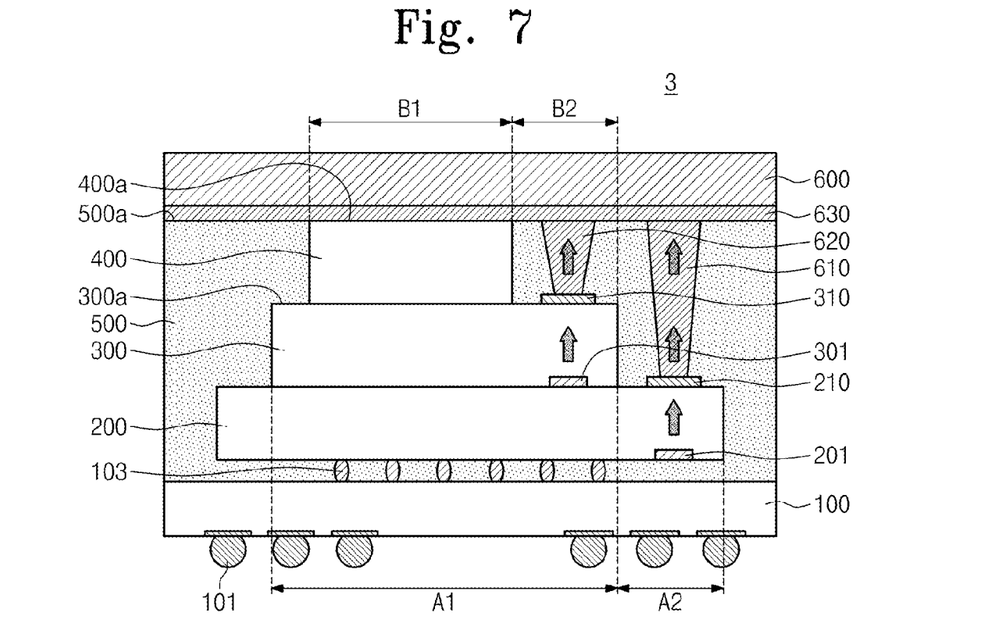
FIG. 7 is a sectional view taken along line I-II of FIG. 6.

FIG. 6 is a plan view illustrating a semiconductor package according to still other example embodiments of the inventive concept, and FIG. 7 is a cross-sectional view taken along line I-II of FIG. 6. For the sake of brevity, the elements and features of this example that are similar to those previously shown and described will not be described in much further detail.

Referring to FIGS. 6 and 7, a semiconductor package 3 may include a substrate 100, a first semiconductor chip 200, a second semiconductor chip 300, a third semiconductor chip 400, a mold layer 500, a lower heat-transfer pattern 210, a lower heat-pathway pattern 610, an upper heat-transfer pattern 310, an upper heat-pathway pattern 620, and a heat-dissipating part 600. The lower heat-transfer pattern 210 may be provided in the heat-transfer region A2 of the first semiconductor chip 200. The lower heat-transfer pattern 210 may be overlapped with the heat source 201. The lower heat-pathway pattern 610 may penetrate the mold layer 500 and may be in contact with the lower heat-transfer pattern 210.

The second semiconductor chip 300 may be mounted on the first semiconductor chip 200 in the chip region A1 thereof. The top surface 300a of the second semiconductor chip 300 may include an upper chip region B1 and an upper heat-transfer region B2. The second semiconductor chip 300 may include an upper heat source 301 provided therein.

The third semiconductor chip 400 may be mounted on the second semiconductor chip 300 in the upper chip region B1 thereof. For example, the third semiconductor chip 400 may be mounted on the second semiconductor chip 300 in a flip-chip bonding manner using solders or bumps (not shown). Alternatively, the third semiconductor chip 400 may be electrically connected to the substrate 100 through bonding wires (not shown).

The upper heat-transfer pattern 310 may be provided in the upper heat-transfer region B2. The upper heat-transfer pattern 310 may be overlapped with the upper heat source 301. The upper heat-transfer pattern 310 may include a material, whose thermal conductivity is higher than that of the mold layer 500. The upper heat-transfer pattern 310 may include a metal material, which may be identical or similar to a material that forms the lower heat-transfer pattern 210 in the previous embodiments described with reference to FIGS. 1 and 2.

The upper heat-pathway pattern 620 may penetrate the mold layer 500 and may be in contact with the lower heat-transfer pattern 210 and the heat-transfer layer 630. The upper heat-pathway pattern 620 may include substantially the same material as the material that forms the lower heat-pathway pattern 610. For example, the upper heat-pathway pattern 620 may include a conductive material and/or a polymer such as an adhesive polymer. When heat is generated from the upper heat source 301 of the second semiconductor chip 300, the heat may be transferred to the heat-dissipating part 600 through the upper heat-transfer pattern 310 and the upper heat-pathway pattern 620. The upper heat-pathway pattern 620 may have a thermal conductivity higher than that of the mold layer 500. Accordingly, the second semiconductor chip 300 can have improved operation reliability, compared with a case where the upper heat-pathway pattern 620 is omitted.

The mold layer 500 may be provided on the substrate 100 to encapsulate the first, second, and third semiconductor chips 200, 300, and 400. The mold layer 500 may have an uppermost surface or top surface 500a substantially coplanar with a top surface 400a of the third semiconductor chip 400. Alternatively, the mold layer 500 may extend between the third semiconductor chip 400 and the heat-transfer layer 630 and cover the top surface 400a of the third semiconductor chip 400.

Hereinafter, a method of fabricating a semiconductor package, according to example embodiments of the inventive concept, will be described with reference to FIGS. 8 through 12.

FIGS. 8 through 12 are cross-sectional views illustrating a method of fabricating a semiconductor package, according to example embodiments of the inventive concept.

Figure 8:
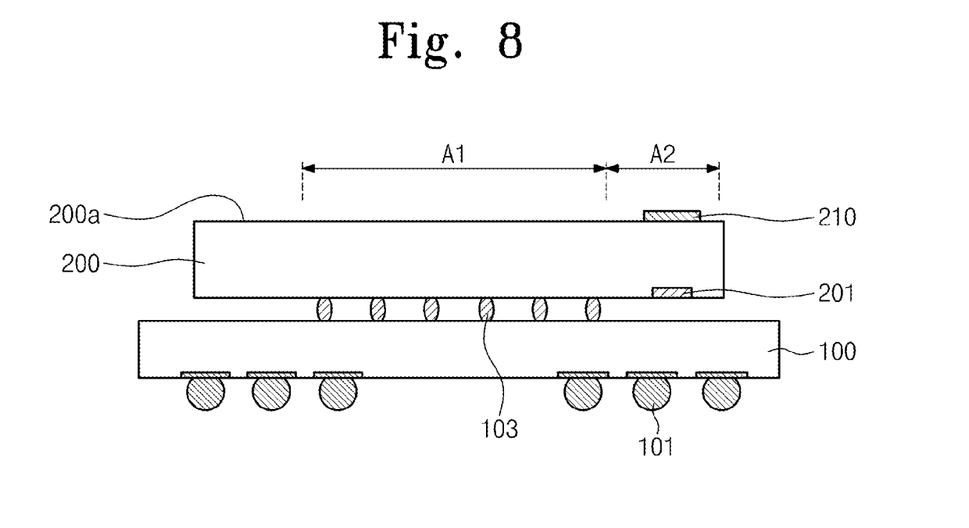
FIGS. 8 through 12 are sectional views illustrating a method of fabricating a semiconductor package, according to example embodiments of the inventive concept.

Referring to FIG. 8, a first semiconductor chip 200 may be mounted on a substrate 100. The first semiconductor chip 200 may have a top surface 200a including a chip region A1 and a heat-transfer region A2. The first semiconductor chip 200 may include a lower heat-transfer pattern 210 provided on the heat-transfer region A2. The lower heat-transfer pattern 210 may be formed using a wafer-level or chip-level process. The lower heat-transfer pattern 210 may be overlapped with the heat source 201 of the first semiconductor chip 200. The lower heat-transfer pattern 210 may be formed to have a shape that is identical or similar to that of FIG. 1 or FIG. 3. The lower heat-transfer pattern 210 may include a metal pattern. The first semiconductor chip 200 may be electrically connected to the substrate 100 via connection terminal 103. In other embodiments, the first semiconductor chip 200 may be electrically connected to the substrate 100 via a bonding wire (not shown).

Figure 9:
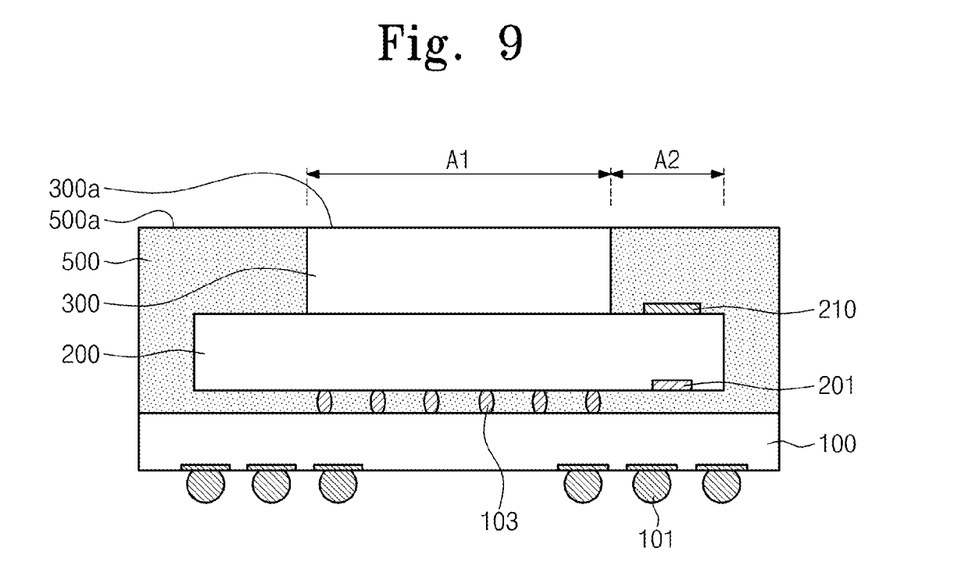

Referring to FIG. 9, a second semiconductor chip 300 may be mounted on the top surface 200a of the first semiconductor chip 200. The second semiconductor chip 300 may be provided in the chip region A1. The second semiconductor chip 300 may be mounted in a flip-chip mounting or wire-bonding manner.

The mold layer 500 may be formed on the substrate 100 to encapsulate the first and second semiconductor chips 200 and 300. For example, the mold layer 500 may be formed of a polymer material, such as an epoxy molding compound. The mold layer 500 may be formed to hermetically seal the first and second semiconductor chips 200 and 300. For example, an uppermost surface 500a of the mold layer 500 may be formed to be substantially the same level as a top surface 300a of the second semiconductor chip 300. Alternatively, the mold layer 500 may be formed to cover the top surface 300a of the second semiconductor chip 300.

Figure 10:
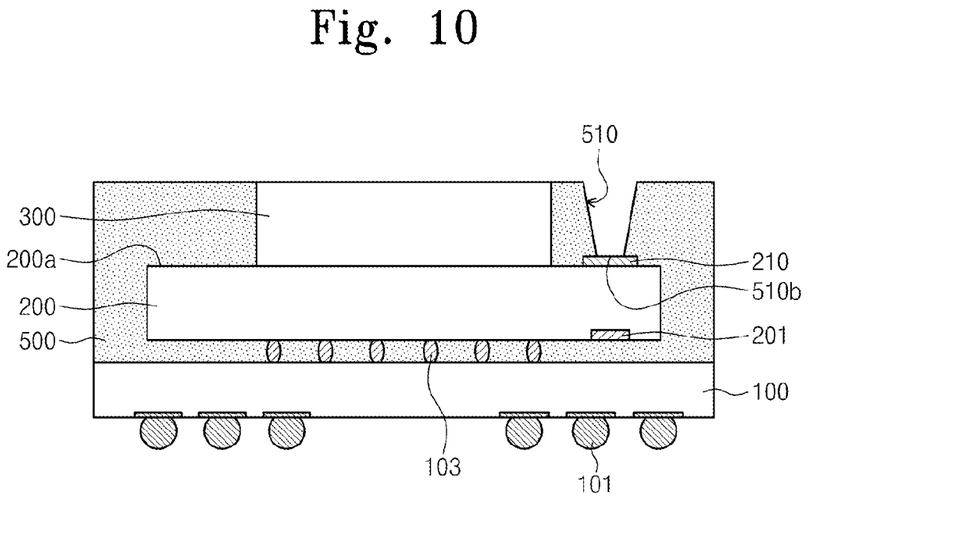

Referring to FIG. 10, an opening 510 may be formed in the mold layer 500 to expose at least a portion of the lower heat-transfer pattern 210. The opening 510 may be formed by removing a portion of the mold layer 500. For example, the opening 510 may be formed by a drilling process. Without the lower heat-transfer pattern 210, the first semiconductor chip 200 may be damaged by the drilling process. According to example embodiments of the inventive concept, a bottom surface 510b of the opening 510 may be positioned at a level higher than the top surface 200a of the first semiconductor chip 200. In other words, due to the presence of the lower heat-transfer pattern 210 provided on the top surface 200a, it is possible to prevent the first semiconductor chip 200 from being damaged, and thereby, to improve reliability of the first semiconductor chip 200.

Figure 11:
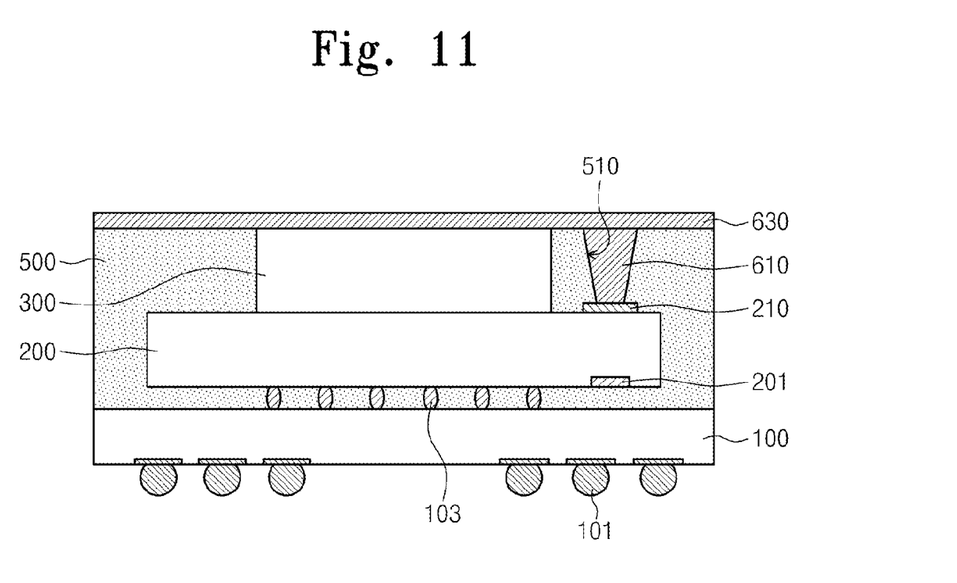

Referring to FIG. 11, a heat-pathway pattern 610 may be formed in the opening 510 to be in contact with the lower heat-transfer pattern 210. For example, the heat-pathway pattern 610 may be formed by depositing or forming a conductive material and/or an adhesive polymer that fills the opening 510. The conductive material may be identical or similar to that for the previous embodiments described with reference to FIGS. 1 and 2. Here, a heat-transfer layer 630 may be formed on the second semiconductor chip 300 and the mold layer 500. In certain embodiments, the formation of the heat-transfer layer 630 may include forming the same material (e.g., a conductive material and/or an adhesive polymer) as the heat-pathway pattern 610 on the second semiconductor chip 300 and the mold layer 500. The heat-transfer layer 630 may be connected to the heat-pathway pattern 610. According to example embodiments of the inventive concept, the heat-transfer layer 630 may be formed by using substantially the same material as the heat-pathway pattern 610. As a result, the fabrication process can be simplified.

Figure 12:
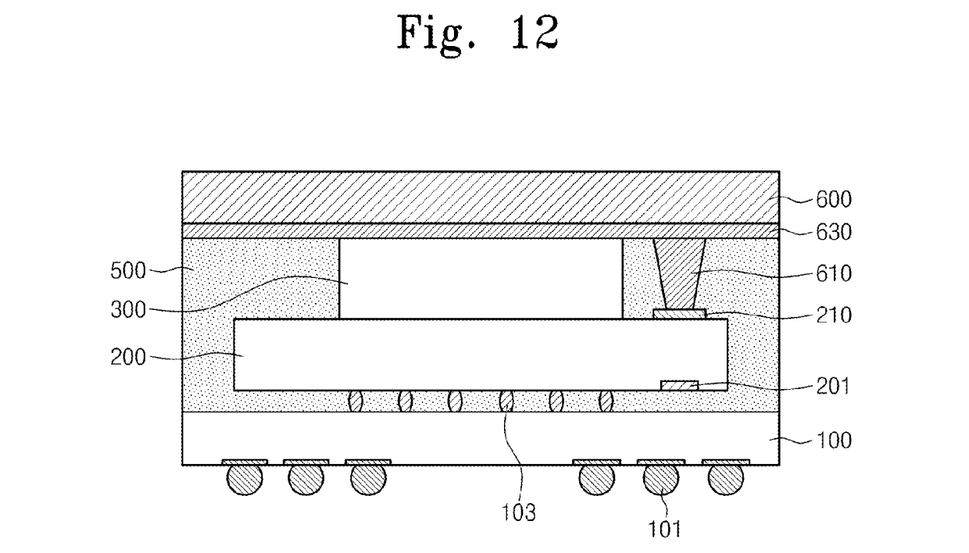

Referring to FIG. 12, a heat-dissipating part 600 may be formed on the heat-transfer layer 630. The heat-dissipating part 600 may be attached to the second semiconductor chip 300 and the mold layer 500 using the heat-transfer layer 630. If the heat-dissipating part 600 includes a graphite sheet, the heat-dissipating part 600 including the heat-transfer layer 630 may be attached on the mold layer 500 and the second semiconductor chip 300.

Figure 13:
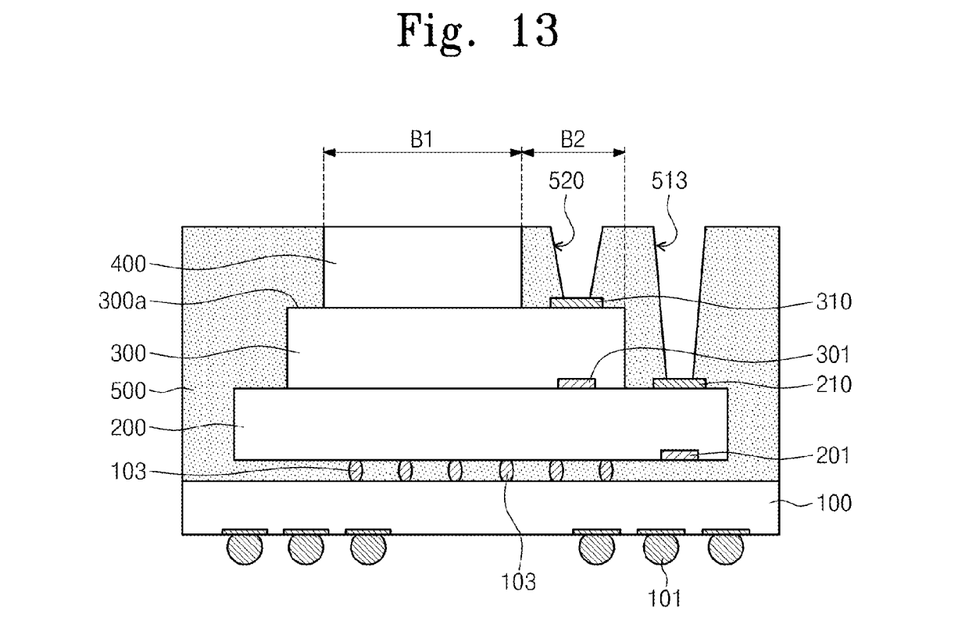
FIGS. 13 and 14 are cross-sectional views illustrating a method of fabricating a semiconductor package, according to other example embodiments of the inventive concept.
Figure 14:
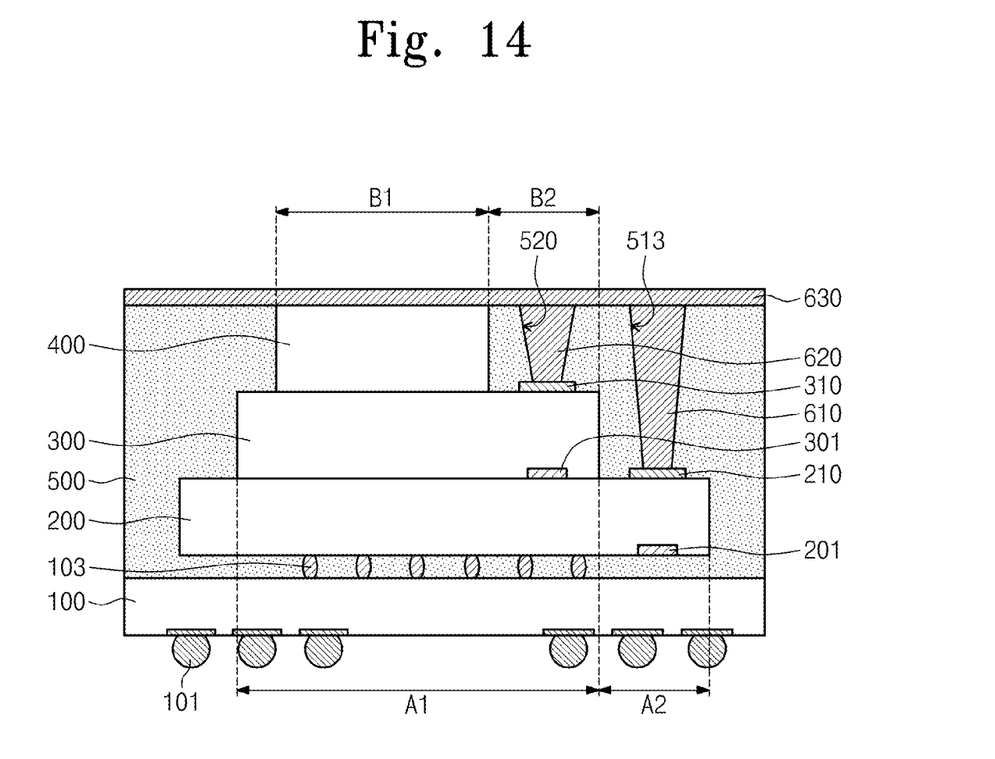

FIGS. 13 and 14 are cross-sectional views illustrating a method of fabricating a semiconductor package, according to other example embodiments of the inventive concept. For the sake of brevity, the elements and features of this example that are similar to those previously shown and described will not be described in much further detail.

Referring to FIG. 13, first and second semiconductor chips 200 and 300 may be mounted on a substrate 100. The first and second semiconductor chips 200 and 300 may be mounted using the same or similar method as described in the previous embodiments with reference to FIGS. 8 and 9. The second semiconductor chip 300 may have a top surface 300a including an upper chip region B1 and an upper heat-transfer region B2. The second semiconductor chip 300 may include an upper heat-transfer pattern 310 formed on the upper heat-transfer region B2. The upper heat-transfer pattern 310 may be formed through a wafer-level or chip-level process. The upper heat-transfer pattern 310 may be overlapped with an upper heat source 301. A mold layer 500 may be formed on the substrate 100 to encapsulate the first, second, and third semiconductor chips 200, 300, and 400. Thereafter, a first opening 513 and a second opening 520 may be formed in the mold layer 500. For example, portions of the mold layer 500 may be removed by a drilling process. The first opening 513 may be formed to expose at least a portion of a lower heat-transfer pattern 210. The second opening 520 may be formed to expose at least a portion of an upper heat-transfer pattern 310. Due to the presence of the lower heat-transfer pattern 210, the first semiconductor chip 200 can be protected from being damaged by the process for forming the first opening 513. Due to the presence of the upper heat-transfer pattern 310, the second semiconductor chip 300 can be protected from being damaged by the process for forming the second opening 520. As a result, reliability of the first and second semiconductor chips 200 and 300 can be substantially improved.

Referring to FIG. 14, a lower heat-pathway pattern 610 and an upper heat-pathway pattern 620 may be formed in the mold layer 500. The lower heat-pathway pattern 610 may be formed to be in contact with the lower heat-transfer pattern 210, and the upper heat-pathway pattern 620 may be formed to be in contact with the upper heat-transfer pattern 310. The lower heat-pathway pattern 610 and the upper heat-pathway pattern 620 may be formed by filling the first opening 513 and the second opening 520, respectively, with a conductive material and/or a polymer material. Accordingly, the upper heat-pathway pattern 620 may include or be formed of substantially the same material as the lower heat-pathway pattern 610. Here, a portion of the material for forming the lower heat-pathway pattern 610 and the upper heat-pathway pattern 620 may be formed to cover the third semiconductor chip 400 and the mold layer 500, thereby constituting a heat-transfer layer 630. The heat-transfer layer 630 may be connected to all of the lower heat-pathway pattern 610 and the upper heat-pathway pattern 620.

Referring back to FIG. 7, the heat-dissipating part 600 may be formed on the heat-transfer layer 630. The heat-dissipating part 600 may be attached to the mold layer 500 and the third semiconductor chip 400 using the heat-transfer layer 630. The semiconductor package 3 of FIG. 7 may be fabricated through the afore-described processes.

Figure 15:
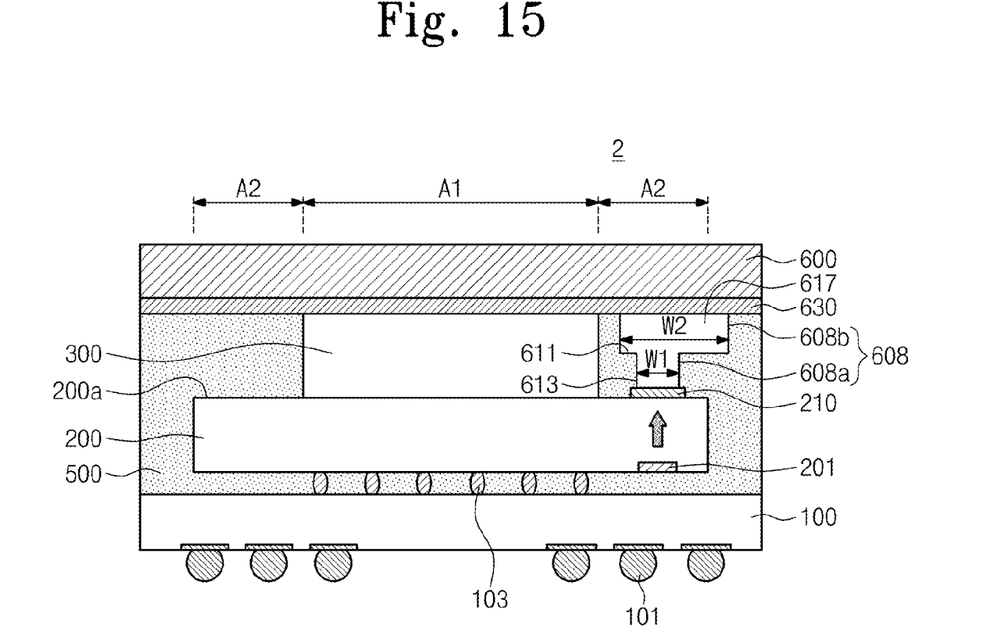
FIG. 15 is a cross-sectional view of a semiconductor package fabricated according to some other embodiments of the inventive concept.

In some other embodiments, as shown in FIG. 15, a mold opening 608 extends through a portion of the mold layer 500 to expose at least a portion of a lower heat transfer pattern 210. The mold opening 608 includes a lower opening 608a and an upper opening 608b in communication with each other, where the upper opening 608b has a substantially greater width W2 than a width W1 of the lower opening 608a. The upper opening 608b may be formed after the lower opening 608a is formed extending through the portion of the mold layer 500. The mold opening 608 may be substantially T-shaped in cross-sectional view. The upper opening 608b may include a lower surface 611. The lower surface 611 may be substantially horizontal. The lower opening 608a may extend from the lower heat transfer pattern 210 to the lower surface 611 of the upper opening 608b. In some embodiments, the lower surface 611 of the upper opening 608b may extend to a sidewall 613 of the lower opening 608a. Thereafter, a heat pathway pattern 617 is formed within the mold opening 608 using a method similar to the methods described with respect to FIGS. 10-11. As a result, the interface area between the heat pathway pattern and the heat transfer layer 630 can be increased, thereby increasing the heat-transfer efficiency of a semiconductor chip 200. Other elements of the embodiment shown in FIG. 15 are the same as or similar to the elements of the embodiment described in FIG. 4.

[Applications]

Figure 16:
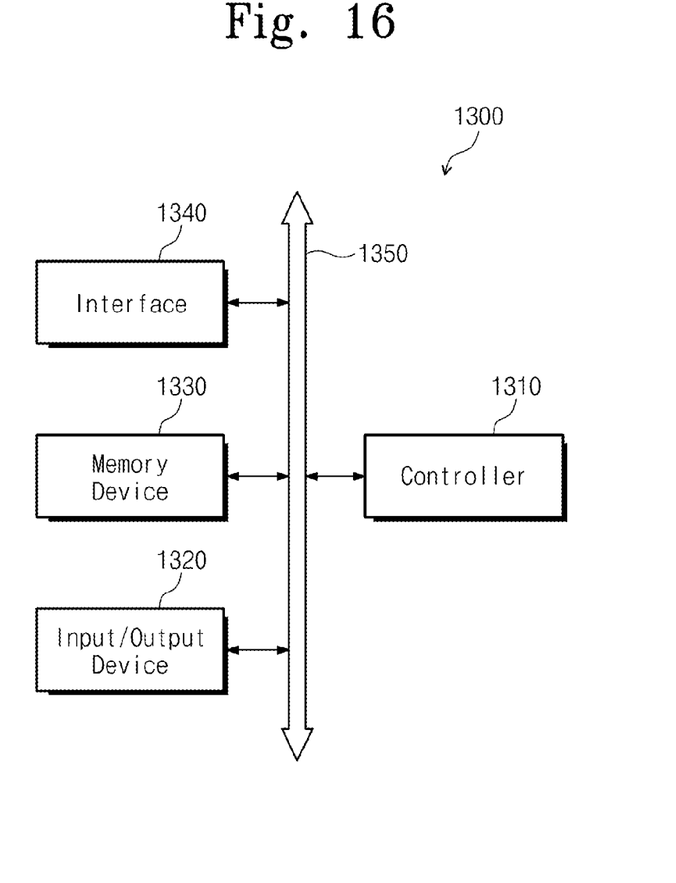
FIG. 16 is a block diagram illustrating an example of electronic systems including a semiconductor package according to example embodiments of the inventive concept.
Figure 17:
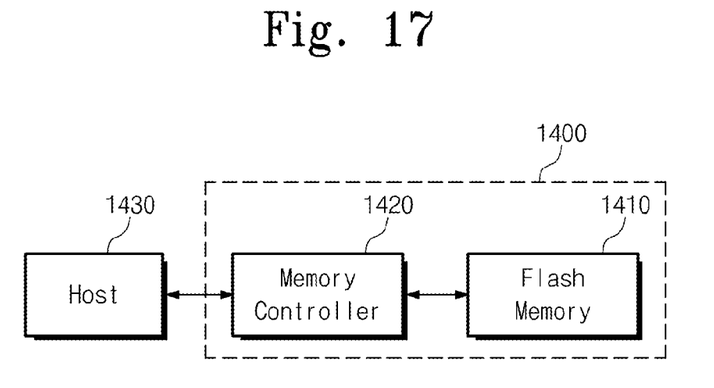
FIG. 17 is a block diagram illustrating an example of memory systems including a semiconductor package according to example embodiments of the inventive concept.

FIG. 16 is a block diagram illustrating an example of electronic systems including a semiconductor package according to some embodiments of the inventive concept. FIG. 17 is a block diagram illustrating an example of memory systems including a semiconductor package according to example embodiments of the inventive concept.

Referring to FIG. 16, an electronic system 1300 may include a controller 1310, an input/output (I/O) unit 1320, and a memory device 1330. The controller 1310, the I/O unit 1320 and the memory device 1330 may be combined with each other through a data bus 1350. The data bus 1350 may correspond to a path through which electrical signals are transmitted. The controller 1310 may include at least one of a microprocessor, a digital signal processor, a microcontroller or another logic device. The other logic device may have a similar function to any one of the microprocessor, the digital signal processor and the microcontroller. The controller 1310 and the memory device 1330 may include one of the semiconductor packages 1, 2, and 3 according to example embodiments of the inventive concept. The I/O unit 1320 may include a keypad, a keyboard and/or a display unit. The memory device 1330 may store data and/or commands executed by the controller 1310. The memory device 1330 may include a volatile memory device and/or a non-volatile memory device. For example, the memory device 1330 may include a FLASH memory device. The flash memory device may be realized as solid state disks (SSD). In this case, the electronic system 1300 may stably store mass data to the flash memory system. The electronic system 1300 may further include an interface unit 1340 which transmits electrical data to a communication network or receives electrical data from a communication network. The interface unit 1340 may operate wirelessly or via a cable, wire, or other suitable conductor. For example, the interface unit 1340 may include an antenna for wireless communication or a transceiver for cable communication. Although not shown in the drawings, an application chipset and/or a camera image processor (CIS) may further be provided in the electronic system 1300.

The electronic system 1300 may be realized as a mobile system, a personal computer, an industrial computer, or a logic system performing various functions. For example, the mobile system may be one of a personal digital assistant (PDA), a portable computer, a tablet PC, a wireless phone, a mobile phone, a laptop computer, a digital music system, and information transmit/receive system. When the electronic system 1300 performs wireless communication, the electronic system 1300 may be used in a communication interface protocol of a communication system such as CDMA, GSM, NADC, E-TDMA, WCDMA, CDMA2000, Wi-Fi, Muni Wi-Fi, Bluetooth, DECT, Wireless USB, Flash-OFDM, IEEE 802.20, GPRS, iBurst, WiBro, WiMAX, WiMAX-Advanced, UMTS-TDD, HSPA, EVDO, LTE-Advanced, MMDS, and so forth.

Referring to FIG. 17, a memory system 1400 may include a non-volatile memory device 1410 and a memory controller 1420. The non-volatile memory device 1410 and the memory controller 1420 may store data or read stored data. The non-volatile memory device 1410 may include at least one of the semiconductor packages 1, 2, and 3 according to example embodiments of the inventive concept. The memory controller 1420 may control the non-volatile memory device 1410 in order to read the stored data and/or to store data in response to read/write request of a host 1430.

According to example embodiments of the inventive concept, the lower heat-transfer pattern may be overlapped with the heat source of the first semiconductor chip. When heat is generated in the heat source of the first semiconductor chip, the heat can be transferred to the heat-dissipating part through the lower heat-transfer pattern and the heat-pathway pattern. Accordingly, it is possible to improve heat-dissipation efficiency and operation reliability of the first semiconductor chip.

During the formation of the heat-pathway pattern, an opening may be formed in the mold layer using, for example, a drilling process. The opening may be formed to expose at least a portion of the lower heat-transfer pattern. Due to the presence of the lower heat-transfer pattern, the first semiconductor chip can be protected from being damaged by the process for forming the opening. Accordingly, the first semiconductor chip can have good reliability.

While example embodiments of the inventive concepts have been particularly shown and described, it will be understood by one of ordinary skill in the art that variations in form and detail may be made therein without departing from the spirit and scope of the attached claims.

What is claimed is:
1. A semiconductor package, comprising:
 a first semiconductor chip mounted on a substrate, the first semiconductor chip having a top surface including a chip region and a heat-transfer region;

a second semiconductor chip mounted on the chip region of the first semiconductor chip;

a lower heat-transfer pattern disposed on the heat-transfer region of the first semiconductor chip;

a mold layer encapsulating the first semiconductor chip and the second semiconductor chip;

a heat-pathway pattern extending through the mold layer and connected to the lower heat-transfer pattern; and a heat-dissipating part disposed on the second semiconductor chip and the mold layer and connected to the heat-pathway pattern, wherein the mold layer covers portions of the lower heat transfer pattern and the heat-pathway pattern.

2. The semiconductor package of claim 1, wherein the first semiconductor chip comprises a heat source, and wherein the lower heat-transfer pattern is overlapped with the heat source.

3. The semiconductor package of claim 1, further comprising a heat-transfer layer disposed between the second semiconductor chip and the heat-dissipating part, wherein the heat-transfer layer includes substantially the same material as the heat-pathway pattern.

4. The semiconductor package of claim 1, wherein the heat-pathway pattern includes a conductive material and/or an adhesive polymer and have a thermal conductivity higher than that of the mold layer.

5. The semiconductor package of claim 1, further comprising:

a third semiconductor chip disposed on the second semiconductor chip, wherein the second semiconductor chip includes an upper chip region and an upper heat-transfer region, the third semiconductor chip is mounted on the upper chip region of the second semiconductor chip, and the mold layer is provided to hermetically seal the first, second, and third semiconductor chips;

an upper heat-transfer pattern disposed on the upper heat-transfer region of the second semiconductor chip; and an upper heat-pathway pattern disposed between the upper heat-transfer pattern and the heat-dissipating part.

6. The semiconductor package of claim 1, wherein the first semiconductor chip comprises a plurality of heat sources spaced apart from each other, and wherein the lower heat-transfer pattern is overlapped with at least two of the heat sources.

7. The semiconductor package of claim 1, wherein the lower heat transfer pattern is a metal pattern.

8. The semiconductor package of claim 7, wherein the lower heat-transfer pattern includes at least one of copper, nickel, gold, or aluminum.

9. A semiconductor package, comprising:

a first semiconductor chip mounted on a substrate;

a second semiconductor chip mounted on a region of the first semiconductor chip;

a heat-transfer pattern disposed on another region of the first semiconductor chip;

a mold layer encapsulating the first semiconductor chip and the second semiconductor chip; and a heat-pathway pattern extending through the mold layer and connected to the heat-transfer pattern, wherein the mold layer covers portions of the heat transfer pattern and the heat-pathway pattern.

10. The semiconductor package of claim 9, wherein the heat-pathway pattern is configured to transfer heat generated from the first semiconductor chip, but not an electronic signal.

11. The semiconductor package of claim 9, wherein a top surface of the heat-pathway pattern is substantially coplanar with a top surface of the mold layer and a top surface of the second semiconductor chip.

12. The semiconductor package of claim 9, further comprising:

a heat-dissipating part disposed on the second semiconductor chip and the mold layer and connected to the heat-pathway pattern.

13. The semiconductor package of claim 9, wherein the first semiconductor chip comprises a heat source, and wherein the lower heat-transfer pattern is overlapped with the heat source.

* * * * *